United States Patent [19]

Mears

[11] 4,251,765
[45] Feb. 17, 1981

[54] AIRCRAFT ELECTRICAL SYSTEM TESTER

[75] Inventor: Shawn P. Mears, Dover, Del.

[73] Assignee: The United States of America as represented by the Secretary of the Air Force, Washington, D.C.

[21] Appl. No.: 10,109

[22] Filed: Feb. 7, 1979

[51] Int. Cl.³ .............................................. G01R 31/02
[52] U.S. Cl. .................................... 324/51; 324/73 R
[58] Field of Search ........................ 324/51, 73 R, 415

[56] References Cited

U.S. PATENT DOCUMENTS

| 4,002,972 | 1/1977 | Konrad et al. | 324/51 |
| 4,015,201 | 3/1977 | Chaffee | 324/51 |
| 4,118,664 | 10/1978 | Fields | 324/51 |

Primary Examiner—Michael J. Tokar
Attorney, Agent, or Firm—Donald J. Singer; Henry S. Miller

[57] ABSTRACT

A portable tester for trouble shooting aircraft electrical systems, particularly condition warning systems including a housing having a plug, adapted to connect a wiring harness from the master controlling display unit, and circuitry which simulates various conditions causing the display panel to react in a known manner. Failure of the display panel to react correctly indicates electrical malfunction.

1 Claim, 2 Drawing Figures

AIRCRAFT ELECTRICAL SYSTEM TESTER

STATEMENT OF GOVERNMENT INTEREST

The invention described herein may be manufactured and used by or for the Government for governmental purposes without the payment of any royalty thereon.

BACKGROUND OF THE INVENTION

This invention relates generally to a means for testing electrical systems and, more particularly, to a portable device for testing multiple sensing systems about aircraft.

Large commercial and military aircraft are equipped with numerous sensing systems which constantly monitor the condition of the aircraft. Besides the normal avionics by which the pilot flys the aircraft, other hydraulic and electrical systems must be monitored for safety and passenger comfort.

One such aircraft, the Air Force C-5A, which is currently the world's largest aircraft utilizes a system referred to as a Master Caution controller. This system is supplemented by a system known as the Auto Caution controller. The controllers are located on the aircraft flight deck and receive as input signals from the various sensing units located throughout the aircraft. The controller's output is sent to display panels located on the instrument panel before the pilot and co-pilot. The Master Caution controller display consists of 45 individual lights which flash to attract attention in the event of a system malfunction. The Auto Caution controller and display is similar and contains 15 individual lights. The pilot or co-pilot as a matter of procedure will press a reset switch which is internally lighted as each malfunction occurs. Pressing the switch stops the flashing light on the display panel and simultaneously shuts off the internally lighted reset switch. The malfunction is verified and the pilot will take corrective action.

In the particular system described and similar systems, it is very likely malfunctions will occur in the caution controller systems. One of the major areas of difficulty is in the display units for both the Master Caution controller and the Auto Caution controller systems. Frequently, short circuits occur in the display units which inevitably cause the controller unit to burn out and be rendered useless.

Currently, there is no means of simply, quickly and safely trouble shooting the controller system. The present procedure is to attempt to locate the defect and then replace the controller unit. In the event the short circuit is not found or there is more than a single defect, the replacement controller unit would immediately be burned out and have to be discarded. The circuitry will then have to be thoroughly and arduously inspected. Besides being time consuming, the inspection carries with it a certain degree of risk because of shock hazard when dealing with high voltage within the close confines of an aircraft.

In addition to the aforementioned difficulties, the cost in terms of money spent for replacement controller units is excessive. Each controller unit costs in excess of several hundred dollars and it is not uncommon to burn out two or three units before finding the short circuit.

The instant invention is the simple, quick and safe way to isolate a defective part, thereby generating savings in both time and money.

SUMMARY OF THE INVENTION

The invention tests all circuits to and from the Master and Auto Caution controllers. Further, it tests the caution and auto lite assembly's internal switches. Power circuits and ground continuity are likewise tested for operation.

The circuit provided by the invention simulates the condition necessary to cause Caution control system panels to function. Carried typically in a black box, the test circuitry is connected by a cable of reasonable length to the display in the cockpit of the aircraft. A series of tests are conducted showing whether or not the unit is functioning properly. If the unit is malfunctioning, it is replaced or repaired. The controller units, Master and Auto are not reconnected to the display units until all electrical defects have been located and corrected.

It is therefore an object of the invention to provide a new and improved system for testing electrical circuitry in aircraft.

It is another object of the invention to provide a new and improved aircraft circuit tester. It is a further object of the invention to provide a system for trouble shooting aircraft electrical systems that is portable and low in cost.

It is still another object of the invention to provide a new and improved aircraft circuit tester that is reliable and easily maintained.

It is still a further object of the invention to provide a new and improved system for testing aircraft circuitry in situ.

It is another object of the invention to provide a circuit tester for aircraft that protects the operator from electrical hazards.

It is another object of the invention to provide a circuit tester for aircraft that allows more rapid inspection of the circuit than any known similar system.

It is another object of the invention to provide a new and improved electrical circuit testing system which is economical to produce and utilizes coventional, currently available components that lend themselves to standard mass production manufacturing techniques.

These and other advantages, features and objects of the invention will become more apparent from the following description taken in connection with the illustrative embodiment in the accompanying drawings.

DESCRIPTION OF THE PREFERRED EMBODIMENT

Figure 1:
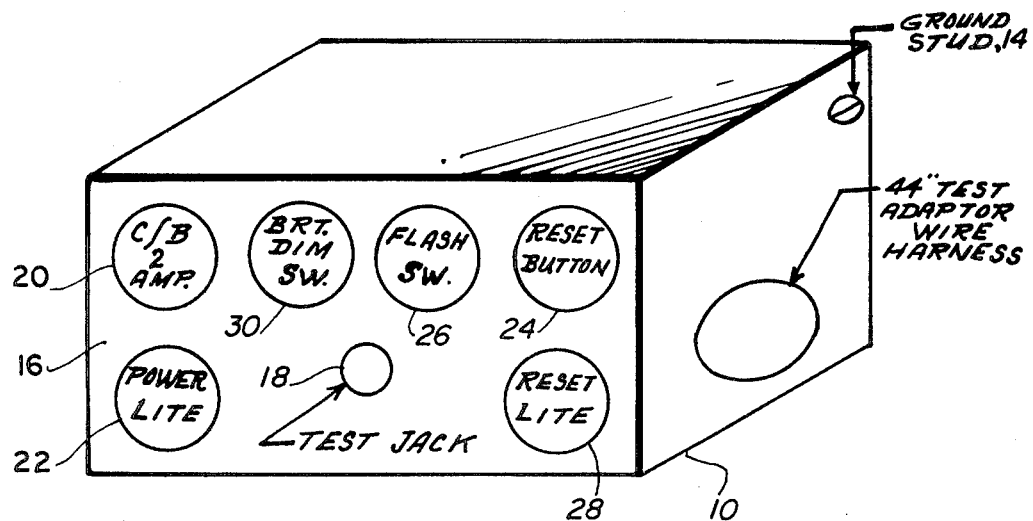
FIG. 1 is a perspective view of the invention

Referring now to FIG. 1, the circuit of the invention is contained in a housing 10 which is completely portable and connected to the present Caution controller by a wire harness connected to plug 12. A ground stud 14 is provided in the event additional grounding is required.

The face 16, of the housing contains test and indicator equipment necessary to perform the required inspection. A test jack 18 is provided when meter readings are desired to verify voltage and current readings.. Circuit breaker 20 protects the circuit and is connected to power lite 22 to indicate that power is on in the Controller.

A reset, momentary switch 24 resets lights after flash switch 26 has been activated, causing lights on the display panel to flash. Reset light 28 indicates when the caution and auto lite assembly's (located on the aircraft) internal switches are checked. The remaining switch 30 tests the caution and auto lite assembly's in both the bright and dim mode of operation.

Figure 2:
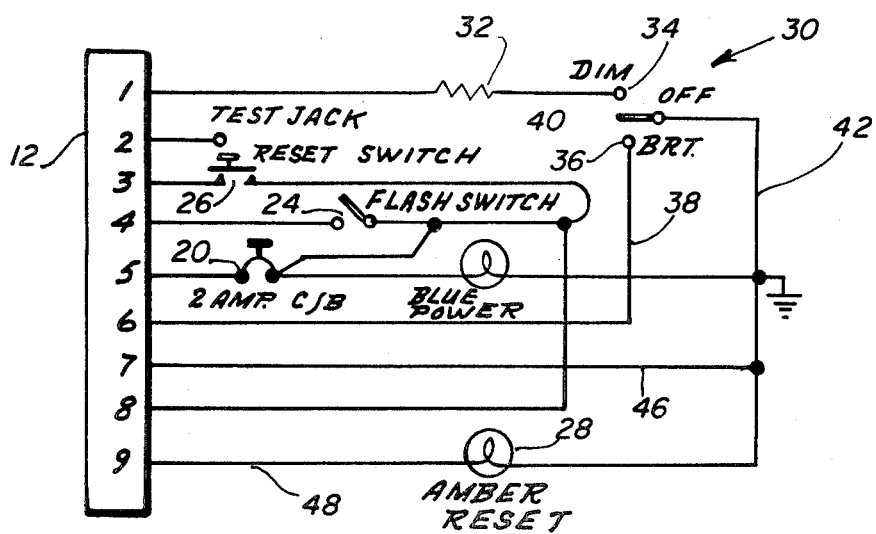
FIG. 2 is a circuit diagram of the invention.

The circuit of FIG. 2 illustrates the operation of the circuits. It should be understood that power is supplied by the plug connected to the caution controlled wiring and the invention tests circuits within the display panel with that power.

Plug 12 contains nine input leads connected to the controller wire harness. Pin one is connected through resistor 32 to contact 34 on switch 30. Contact 36 is connected via line 38 to pin 6 of plug 12. Switch blade 40 is connected to ground via line 42. In operation, the dim and bright condition of the light circuits are tested by moving the switch blade between the appropriate contacts.

Pin two of plug 12 is connected to test jack 18. Pins three and four are connected through flash switch 26 and reset switch 24. Power is taken from pin five after circuit breaker 20. The closing of flash switch 26 activates the display panel flash circuit via pin four. Reset switch 24 tests the reset circuit via pin three.

Pin seven provides the tester with an aircraft ground via line 46. Pin nine activates reset light 28 via line 48 checking reset switch contacts in the caution or auto light assembly.

Although the invention has been described with reference to a particular embodiment, it will be understood to those skilled in the art that the invention is capable of a variety of alternative embodiments within the spirit and scope of the appended claims.

What is claimed is:

1. A portable electrical inspection device for testing caution controller systems in aircraft comprising a housing; a plug having a plurality of pins mounted on the housing adapted to be connected to a caution control system; a plurality of lights mounted on the housing; a plurality of switches mounted on the housing; an electrical circuit within the housing connected between said plug and said lights and switches and including a circuit breaker connected between one pin and ground; a three way switch connected between two pins and the circuit breaker, an on-off switch and a momentary switch connected between two pins, and a light connected between one pin and ground;, whereby action of the switching will test circuits external to the device and cause lights to indicate external circuit conditions.

* * * * *